US006829193B2

(12) United States Patent

Ishizuka

(10) Patent No.: US 6,829,193 B2

(45) Date of Patent: Dec. 7, 2004

(54) POWER SUPPLY CONTROL CIRCUIT FOR USE IN SEMICONDUCTOR STORAGE DEVICE

(75) Inventor: Yasuhiro Ishizuka, Tokyo (JP)

(73) Assignees: Renesas Technology Corp., Tokyo (JP); Mitsubishi Electric Engineering Company Limited, Tokyo (JP)

(*) Notice: Subject to any disclaimer, the term of this patent is extended or adjusted under 35 U.S.C. 154(b) by 293 days.

(21) Appl. No.: 10/162,200

(22) Filed: Jun. 5, 2002

(65) Prior Publication Data

US 2003/0011313 A1 Jan. 16, 2003

(30) Foreign Application Priority Data

Jul. 11, 2001 (JP) ....................................... 2001-211170

(51) Int. Cl.[7] .................................................. G11C 7/00

(52) U.S. Cl. .................. 365/226; 365/201; 365/230.03; 714/14

(58) Field of Search ................................ 365/226, 201, 365/230.03; 714/14

(56) References Cited

U.S. PATENT DOCUMENTS 6,038,186 A * 3/2000 Tanizaki ..................... 365/222
6,385,115 B1 * 5/2002 Nakai .......................... 365/226
6,551,846 B1 * 4/2003 Furutani et al. .............. 438/17
6,731,561 B2 * 5/2004 Abe et al. ................... 365/226

FOREIGN PATENT DOCUMENTS

JP 09231754 9/1997

* cited by examiner

*Primary Examiner*—Connie C. Yoha

(74) *Attorney, Agent, or Firm*—Burns, Doane, Swecker & Mathis, L.L.P.

(57) ABSTRACT

A power supply control circuit for use in a semiconductor storage device is provided. The power supply control circuit comprises a first power supply circuit connected to all subarrays of the semiconductor storage device, for supplying power to all the subarrays, an operation mode determination circuit for determining an operation mode in which the semiconductor storage device is placed and for generating a first block selection signal based on address information applied thereto according to the determined operation mode, a row control circuit disposed for each of all the subarrays, for generating a second block selection signal based on the first block selection signal according to the determined operation mode, and a second power supply circuit disposed for each of all the subarrays, for supplying power to a corresponding one of all the subarrays according to the second block selection signal from a corresponding row control circuit.

4 Claims, 9 Drawing Sheets

VPP PUMP CIRCUIT
ROW DECODER
3
2
5
6

VPP PUMP CIRCUIT
ROW DECODER
3
2
5
6

VPP PUMP CIRCUIT
ROW DECODER
3
2
5
6

1
SUBARRAY
2
ROW DECODER
3
VPP PUMP CIRCUIT
VPP
13
VPP CONTROL CIRCUIT
VPP
14
ROW CONTROL CIRCUIT
4
AUXILIARY VPP PUMP CIRCUIT
VPP
12
ROW DECODER
11
COMMAND ADDRESS CONTROL CIRCUIT
EXTERNALLY INPUT COMMAND
EXTERNALLY INPUT ADDRESS

SUBARRAY
1
VPP
3
VPP PUMP CIRCUIT
2
ROW DECODER
VPP
13
VPP CONTROL CIRCUIT
14
ROW CONTROL CIRCUIT
4
AUXILIARY VPP PUMP CIRCUIT
VPP
12
ROW DECODER
11
COMMAND ADDRESS CONTROL CIRCUIT
EXTERNALLY INPUT COMMAND
EXTERNALLY INPUT ADDRESS

POWER SUPPLY CONTROL CIRCUIT FOR USE IN SEMICONDUCTOR STORAGE DEVICE

BACKGROUND OF THE INVENTION

1. Field of the Invention

The present invention relates to a power supply control circuit for use in a semiconductor storage device, which can optimize the ability to supply power according to an operation mode in which the semiconductor storage device is placed.

2. Description of the Prior Art

FIG. 12 is a block diagram showing an arrangement of a prior art power supply control circuit for use in a semiconductor storage device (e.g. DRAM), in which an arrangement of a VPP pump circuit with respect to a memory array of the semiconductor storage device is illustrated. In FIG. 12, reference numeral 101 denotes a subarray that is a part of the memory array of the semiconductor storage device, reference numeral 102 denotes a row decoder, and reference numeral 103 denotes a VPP pump circuit. In general, the VPP pump circuit consists of a main pump circuit that operates when the semiconductor storage device is activated and a small pump circuit that is mainly used to hold the level of each cell when the semiconductor storage device is on standby. The main pump circuit and the small pump circuit are arranged locally on a chip equipped with the semiconductor storage device.

FIGS. 13A to 13C are drawings showing operation modes of the prior art semiconductor storage device. In FIGS. 13A to 13C, since the same reference numerals as shown in FIG. 12 denote the same components or like components, the explanation of those components will be omitted hereafter. In FIGS. 13A to 13C, reference numeral 104 denotes a selected subarray which is hatched in the figure. FIG. 13A shows normal active mode, FIG. 13B refreshing mode, and FIG. 13C shows test mode (disturbance acceleration test state).

In operation, in the semiconductor storage device, since the number of word lines selected differs according to the operation mode in which the semiconductor storage device is placed, the number of selected subarrays 104 also differs according to the operation mode in which the semiconductor storage device is placed. As a result, the power consumption in the semiconductor storage device differs according to the operation mode in which the semiconductor storage device is placed. For example, as shown in FIGS. 13A to 13C, the ratio among the amounts of power consumption of VPP supplied by the VPP pump circuit 103 at the normal active mode, at the test mode, and at the refreshing mode can be 1:4:8.

When the VPP pump circuit 103 of the semiconductor storage device is designed so that the ability to supply VPP is maximized at the normal active mode and the refreshing mode, the ability to supply VPP is not sufficient at the test mode. If the ability to supply VPP is not sufficient at the test mode, since it takes much time to test the semiconductor storage device and the voltage level of VPP decreases, the frequency of detection of defective pieces will decrease. In contrast, when the VPP pump circuit 103 of the semiconductor storage device is designed so that the ability to supply VPP is maximized at the test mode, the ability to supply VPP becomes excessive and therefore the power consumption increases at the normal active mode and at the refreshing mode.

A problem with a prior art power supply control circuit constructed as mentioned above for use in a semiconductor storage device is that since the power consumption differs according to the operation mode in which the semiconductor storage device is placed, the frequency of detection of defective pieces decreases at the test mode when the ability to supply power is insufficient, whereas the power consumption increases when the ability to supply power becomes excessive.

SUMMARY OF THE INVENTION

The present invention is proposed to solve the above-mentioned problem, and it is therefore an object of the present invention to provide a power supply control circuit for use in a semiconductor storage device, capable of increasing the frequency of detection of defective pieces and stabilizing the power consumption by optimizing the ability to supply power according to the operation mode in which the semiconductor storage device is placed.

In accordance with an aspect of the present invention, there is provided a power supply control circuit for use in a semiconductor storage device, the circuit comprising: a first power supply circuit connected to all subarrays of the semiconductor storage device, for supplying power to all the subarrays; an operation mode determination circuit for determining an operation mode in which the semiconductor storage device is placed and for generating a first block selection signal based on address information applied thereto according to the determined operation mode; a row control circuit disposed for each of all the subarrays, for generating a second block selection signal based on the first block selection signal according to the determined operation mode; and a second power supply circuit disposed for each of all the subarrays, for supplying power to a corresponding one of all the subarrays according to the second block selection signal from a corresponding row control circuit. Accordingly, the power supply control circuit can efficiently supply VPP at the instant, at which the power consumption of VPP is large, following the selection of one or more subarrays, and can also efficiently supply VPP to one or more selected subarrays in which the power consumption of VPP is large. In addition, since even if which any one or more subarrays are selected in either of the operation modes one or more second power supply circuits corresponding to the one or more selected subarrays can thus be activated, the ability to supply VPP can be optimized. Furthermore, since the ability to supply VPP can be optimized according to the operation mode in which the semiconductor storage device is placed, the frequency of detection of defective pieces can be increased and the power consumption can be stabilized.

In accordance with another aspect of the present invention, the operation mode determination circuit includes a selector for generating an internal address based on the address information according to the determined operation mode, and a decoder for generating the first block selection signal based on the internal address generated by the selector according to the determined operation mode.

In accordance with a further aspect of the present invention, the power supply control circuit further comprises a control circuit for outputting a detection signal indicating a voltage level of the power supplied to all the subarrays, and the second power supply circuit supplies the power to the corresponding one of all the subarrays in response to the detection signal from the control circuit while the semiconductor storage device is placed in predetermined operation mode. Accordingly, the power supply control circuit can handle any decrease in the voltage level of VPP which occurs when the semiconductor storage device remains at the predetermined state for a long time.

Further objects and advantages of the present invention will be apparent from the following description of the preferred embodiments of the invention as illustrated in the accompanying drawings.

DETAILED DESCRIPTION OF THE PREFERRED EMBODIMENTS

Embodiment 1.

Figure 1:
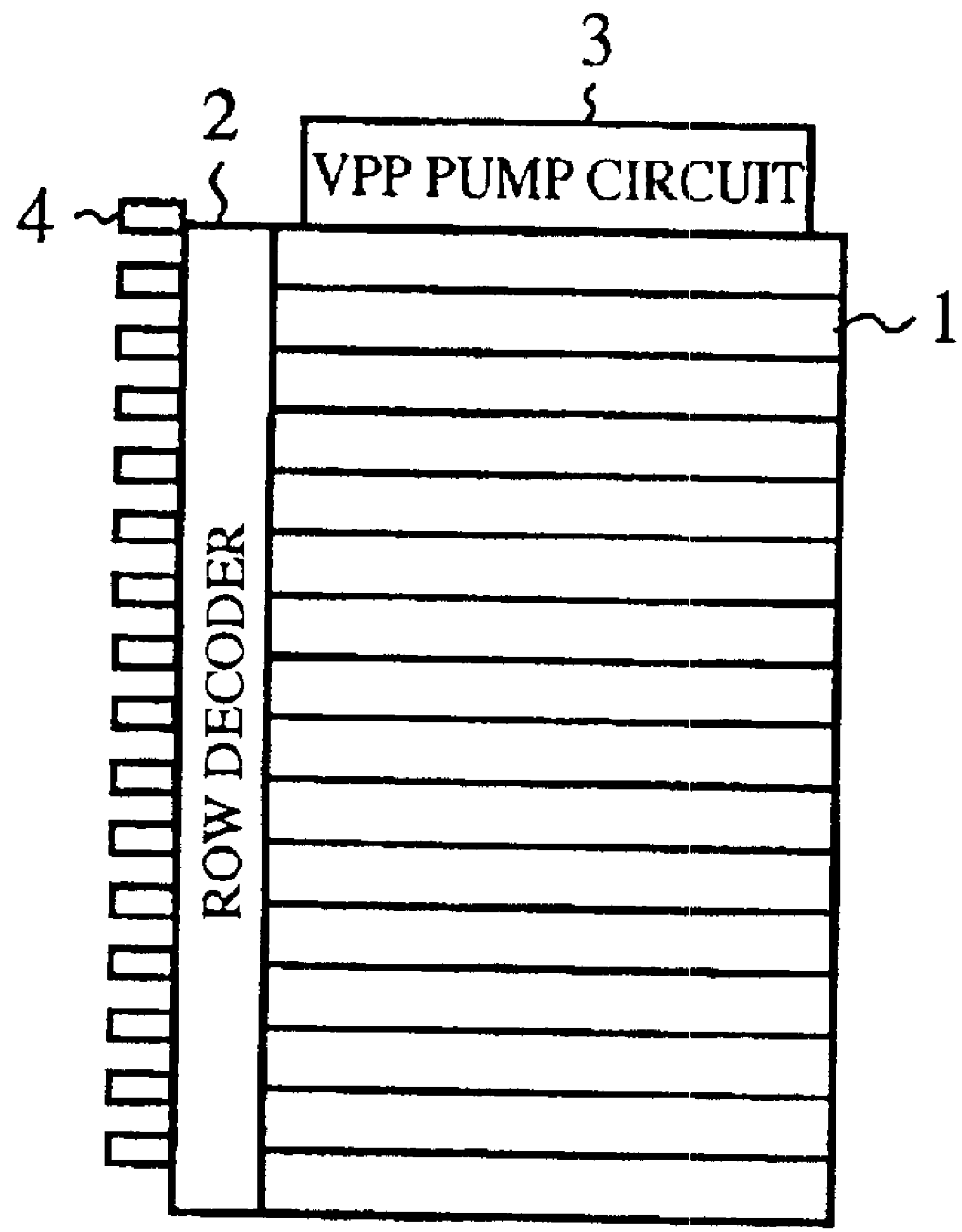
FIG. 1 is a block diagram showing an arrangement of a power supply control circuit of a semiconductor storage device according to a first embodiment of the present invention.

FIG. 1 is a block diagram showing an arrangement of a power supply control circuit for use in a semiconductor storage device (e.g. DRAM), according to a first embodiment of the present invention. FIG. 1 shows an arrangement of a VPP pump circuit with respect to a memory array of the semiconductor storage device. In FIG. 1, reference numeral 1 denotes a subarray which is a part of the memory array of the semiconductor storage device, reference numeral 2 denotes a row decoder, reference numeral 3 denotes the VPP pump circuit for supplying power to all subarrays, and reference numeral 4 denotes an auxiliary VPP pump circuit disposed for each of all the subarrays, for supplying power to a corresponding subarray. The VPP pump circuit includes a main pump circuit that operates when the semiconductor storage device is activated and a small pump circuit that is chiefly used to hold the level of each cell when the semiconductor storage device is on standby.

Figure 2C:
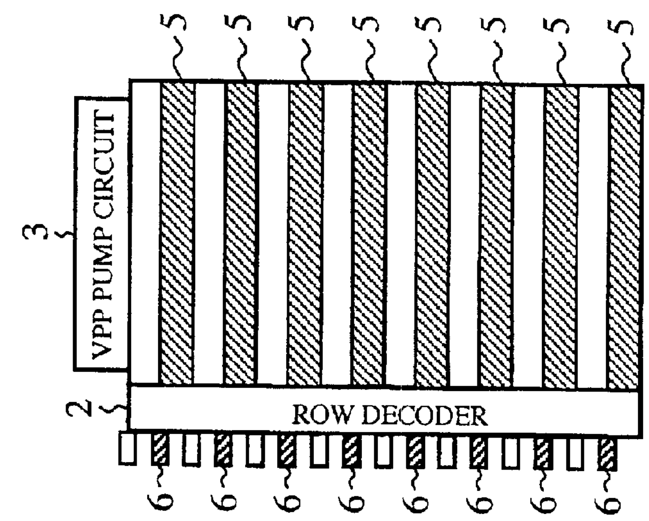
FIGS. 2A to 2C are drawings showing operation modes of the semiconductor storage device according to the first embodiment of the present invention.
Figure 2B:
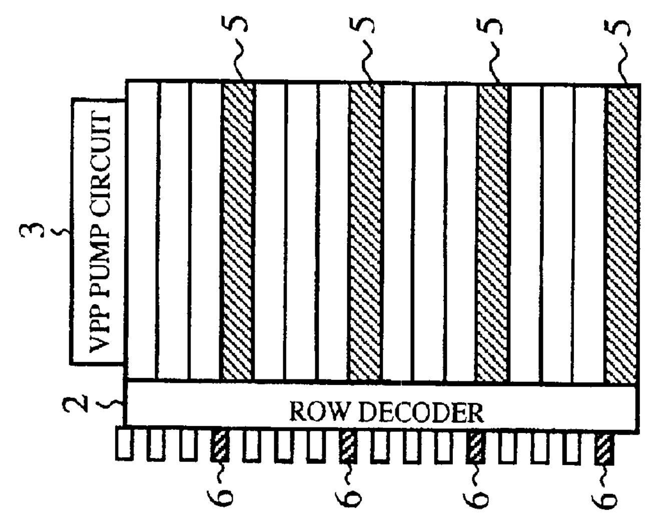
Figure 2A:
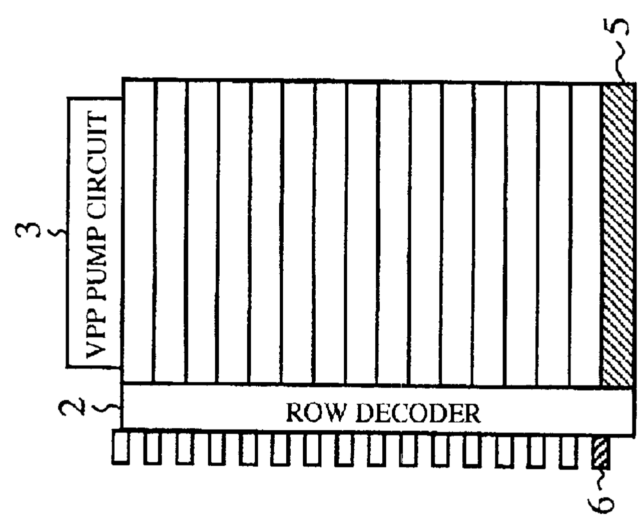

FIGS. 2A to 2C are drawings for showing operation modes of the semiconductor storage device according to the first embodiment of the present invention. In FIGS. 2A to 2C, the same reference numerals as shown in FIG. 1 denote the same components as those of the first embodiment or like components, and therefore the explanation of those components will be omitted hereafter. Reference numeral 5 denotes a selected subarray which is hatched in the figure, and reference numeral 6 denotes an activated auxiliary VPP pump circuit which corresponds to one selected subarray 5, and which is also hatched in the figure. FIG. 2A is a drawing showing that the semiconductor storage device is placed in normal active mode, FIG. 2B is a drawing showing that the semiconductor storage device is placed in refreshing mode, and FIG. 2C is a drawing showing that the semiconductor storage device is placed in test mode (disturbance acceleration test state).

Figure 3:
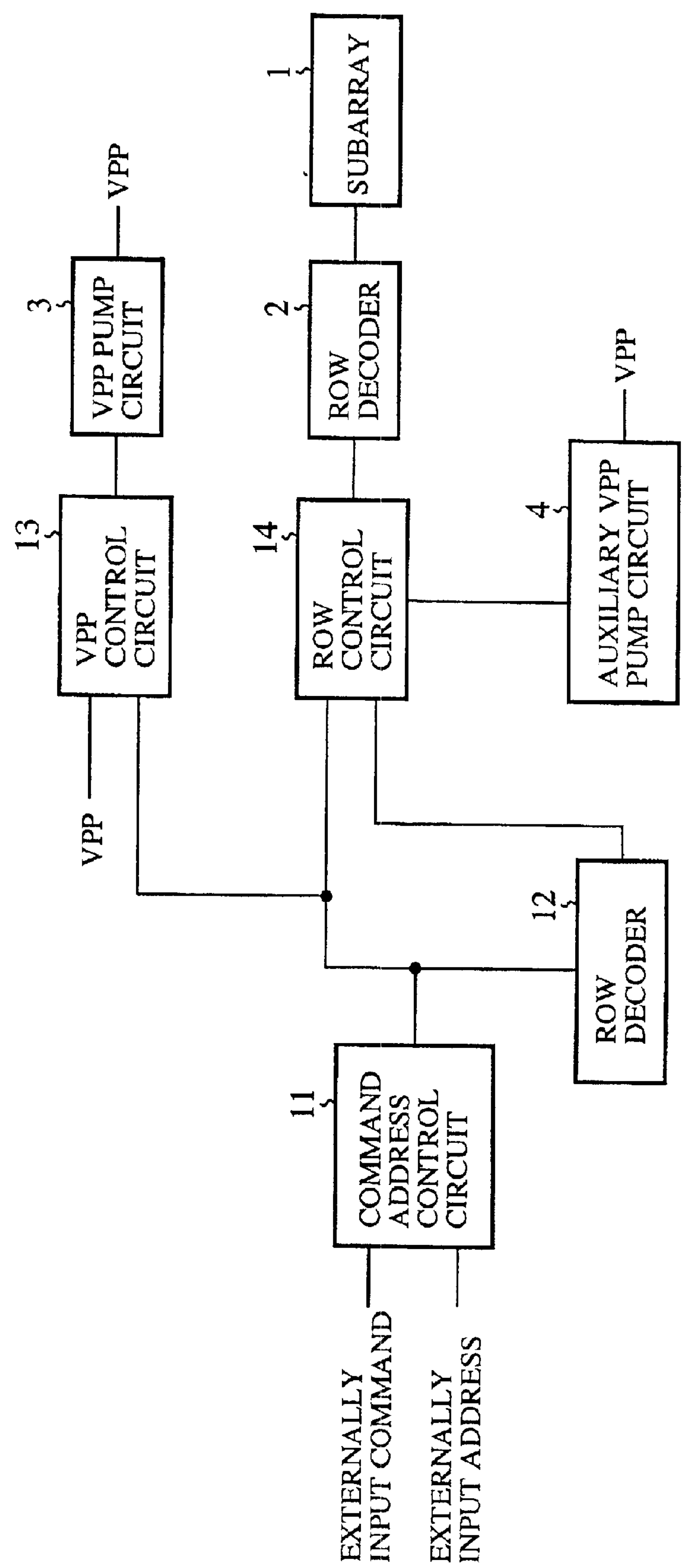
FIG. 3 is a block diagram showing the structure of the power supply control circuit of the semiconductor storage device according to the first embodiment of the present invention.

FIG. 3 is a block diagram showing the structure of the power supply control circuit for use in the semiconductor storage device according to the first embodiment of the present invention. In FIG. 3, the same reference numerals as shown in FIG. 1 denote the same components as those of the first embodiment or like components, and therefore the explanation of those components will be omitted hereafter. Reference numeral 11 denotes a command address control circuit including a command decoder for identifying an externally input command, and an internal address generation circuit for generating an internal address from an externally input address, reference numeral 12 denotes a row pre-decoder including a block selection signal generation circuit which will be described later, reference numeral 13 denotes a VPP control circuit for outputting a detection signal and an activation signal to control the VPP pump circuit 3, and reference numeral 14 denotes a row control circuit disposed for each of all the subarrays 1.

Figure 4:
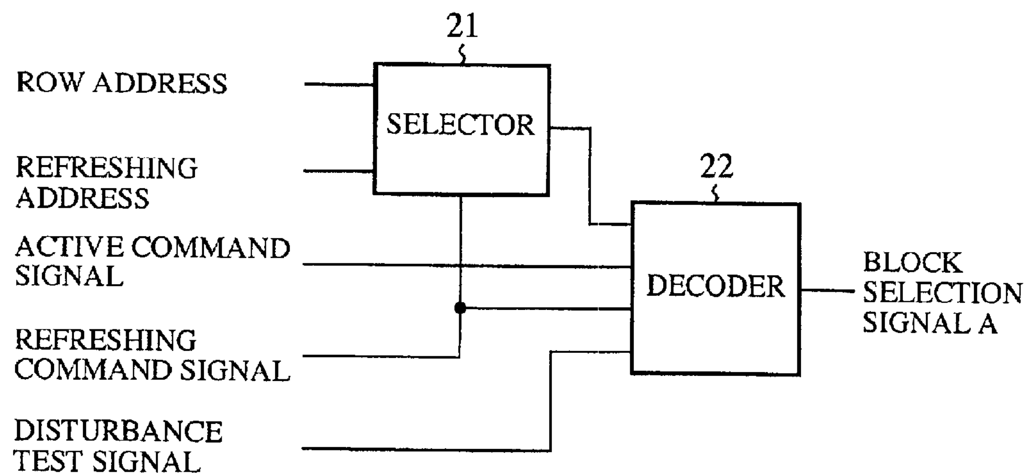
FIG. 4 is a block diagram showing the structure of a block selection signal generation circuit of the power supply control circuit according to the first embodiment of the present invention.
Figure 5:
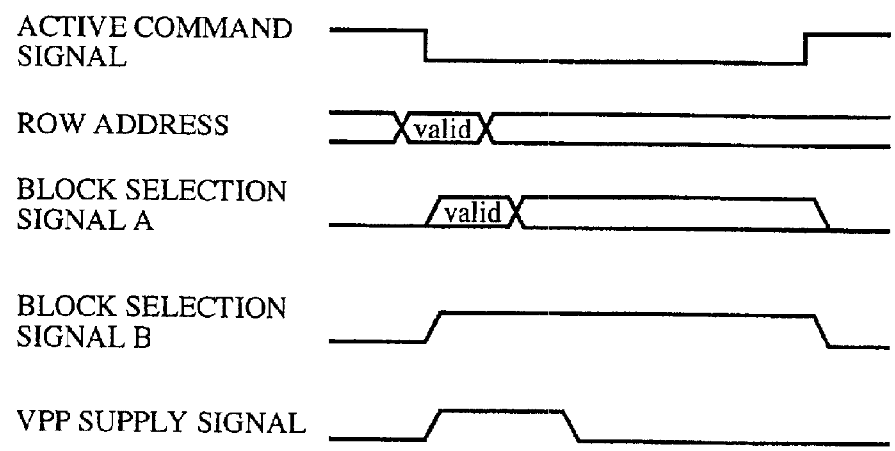
FIG. 5 is a timing chart showing an operation of the power supply control circuit according to the first embodiment of the present invention when the semiconductor storage device is placed in normal active mode.
Figure 6:
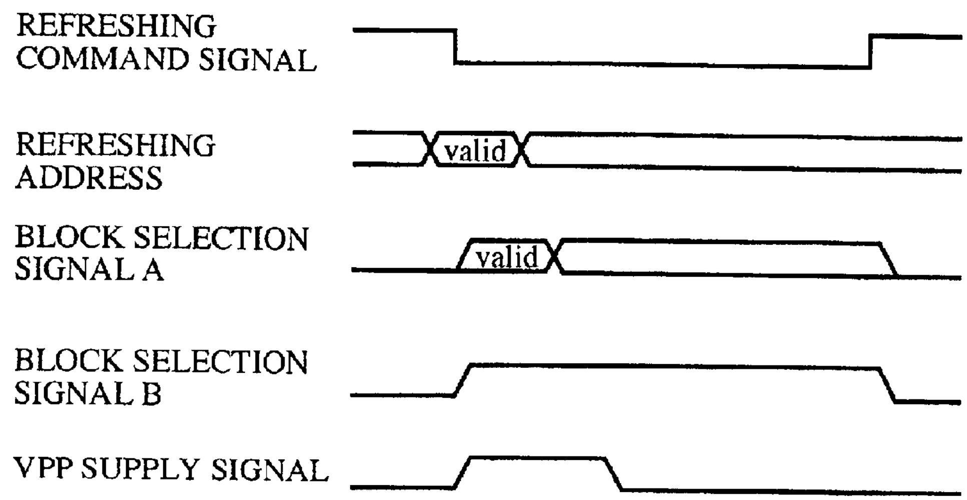
FIG. 6 is a timing chart showing an operation of the power supply control circuit according to the first embodiment of the present invention when the semiconductor storage device is placed in refreshing mode.
Figure 7:
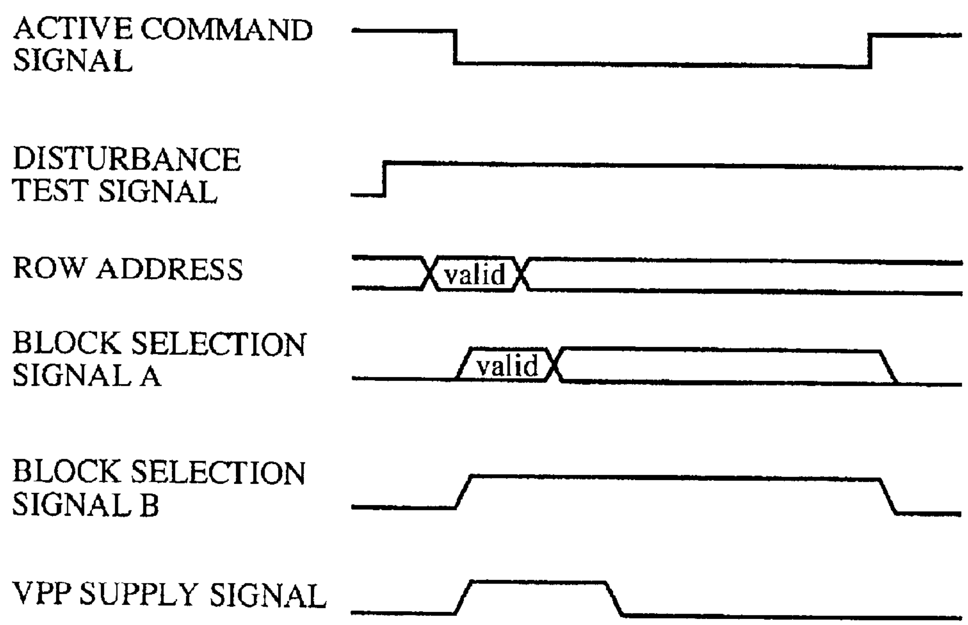
FIG. 7 is a timing chart showing an operation of the power supply control circuit according to the first embodiment of the present invention when the semiconductor storage device is placed in test mode.

FIG. 4 is a block diagram showing the structure of the block selection signal generation circuit of the power supply control circuit according to the first embodiment of the present invention. In FIG. 4, reference numeral 21 denotes a selector for selecting and outputting a refreshing address based on a refreshing command signal when the semiconductor storage device is placed in the refreshing mode, and for selecting and outputting a row address when the semiconductor storage device is placed in any mode other than the refreshing mode, and reference numeral 22 denotes a decoder for outputting a block selection signal A based on a command signal to cause the semiconductor storage device to enter an operation mode and the address output from the selector circuit 21. FIGS. 5 to 7 are timing charts showing operations of the power supply control circuit of the semiconductor storage device according to the first embodiment of the present invention. FIG. 5 is a timing chart showing an operation of the power supply control circuit when the semiconductor storage device is placed in the normal active mode, FIG. 6 is a timing chart showing an operation of the power supply control circuit when the semiconductor storage device is placed in the refreshing mode, and FIG. 7 is a timing chart showing an operation of the power supply control circuit when the semiconductor storage device is placed in a disturbance acceleration test state using the test mode.

The description is directed to the normal active mode with reference to FIG. 5. First of all, a command and an address that make the semiconductor storage device enter an active state from outside the semiconductor storage device are input to the command address control circuit 11. The command address control circuit 11 then generates and outputs an active command signal and a row address, as the internal address, to both the row pre-decoder 12 and all row control circuits 14. In the row pre-decoder 12, the selector 21 of the block selection signal generation circuit selects the row address and then outputs it to the decoder 22. The decoder 22 then decodes the row address so as to output a block selection signal A according to the active command signal. As shown in FIG. 2A, when the semiconductor storage device is placed in the normal active mode, the number of selected subarrays 5 is 1. For instance, the decoder 22 outputs a block selection signal A at state "1" to one row control circuit 14 corresponding to the selected subarray 5, and outputs a block selection signal A at state "0" to other row control circuits 14 corresponding to other subarrays 5. Each block selection signal A becomes significant when it is at state "1".

Next, in response to the active command signal and the block selection signal A, the selected row control circuit 14 outputs a block selection signal B to a corresponding auxiliary VPP pump circuit 4. The block selection signal B has two states "0" and "1", for example, and becomes significant when it is at state "1". In response to the block selection signal B the corresponding auxiliary VPP pump circuit 4 then outputs a VPP supply signal once and supplies VPP (power) to the selected subarray.

The active command signal output from the command address control circuit 11 is also input to the VPP control circuit 13. While the command address control circuit 11 outputs the active command signal, the VPP control circuit 13 outputs a detection signal that indicates the voltage level of VPP, and also outputs an activation signal to cause the VPP pump circuit 3 to operate to the VPP pump circuit 3 when the voltage level of VPP is lower than a reference voltage level.

The description is directed to the refreshing mode with reference to FIG. 6. First of all, a command and an address that make the semiconductor storage device enter a refreshing state from outside the semiconductor storage device are input to the command address control circuit 11. The command address control circuit 11 then outputs a refreshing command signal and a refreshing address, as the internal address, to both the row pre-decoder 12 and the row control circuit 14. In the row pre-decoder 12, the selector 21 of the block selection signal generation circuit selects the refreshing address and then outputs it to the decoder 22. The decoder 22 then decodes the refreshing address so as to output a block selection signal A according to the refreshing command signal. As shown in FIG. 2B, when the semiconductor storage device is placed in the refreshing mode, the number of selected subarrays 5 is 4. For instance, the decoder 22 outputs a block selection signal A at state "1" to four row control circuits 14 corresponding to the selected four subarrays 5, and outputs a block selection signal A at state "0" to other row control circuits 14 corresponding to other subarrays 5. Each block selection signal A becomes significant when it is at state "1".

Next, in response to the refreshing command signal and the block selection signal A, each of the four selected row control circuits 14 outputs a block selection signal B to a corresponding auxiliary VPP pump circuit 4. The block selection signal B has two states "0" and "1", for example, and becomes significant when it is at state "1". In response to the block selection signal B the corresponding auxiliary VPP pump circuit 4 then outputs a VPP supply signal once and supplies VPP to a corresponding subarray.

The refreshing command signal output from the command address control circuit 11 is also input to the VPP control circuit 13. While the command address control circuit 11 outputs the refreshing command signal, the VPP control circuit 13 outputs a detection signal that indicates the voltage level of VPP, and also outputs an activation signal to cause the VPP pump circuit 3 to operate to the VPP pump circuit 3 when the voltage level of VPP is lower than the reference voltage level.

The description is directed to a disturbance acceleration test state using the test mode with reference to FIG. 7. First of all, a signal that causes the semiconductor storage device to carry out a disturbance acceleration test using the test mode is input to the command address control circuit 11 from outside the semiconductor storage device. The command address control circuit 11 then outputs a disturbance test signal to the row pre-decoder 12. Next, in the block selection signal generation circuit of the row pre-decoder 12, the decoder 22 recognizes that a disturbance acceleration test is started. A command and an address that make the semiconductor storage device enter an active state from outside the semiconductor storage device are then input to the command address control circuit 11. The command address control circuit 11 then outputs an active command signal and a row address, as the internal address, to both the row pre-decoder 12 and the row control circuit 14. In the row pre-decoder 12, the selector 21 of the block selection signal generation circuit selects the row address and then outputs it to the decoder 22. The decoder 22 then decodes the row address so as to output a block selection signal A according to the disturbance test signal and the active command signal. As shown in FIG. 2C, when the semiconductor storage device is placed in the disturbance acceleration test state, the number of selected subarrays 5 is 8. For instance, the decoder 22 outputs a block selection signal A at state "1" to eight row control circuits 14 corresponding to the selected eight subarrays 5, and outputs a block selection signal A at state "0" to other row control circuits 14 corresponding to other subarrays 5. Each block selection signal A becomes significant when it is at state "1".

Next, in response to the active command signal and the block selection signal A, each of the eight selected row control circuits 14 outputs a block selection signal B to a corresponding auxiliary VPP pump circuit 4. The block selection signal B has two states "0" and "1", for example, and becomes significant when it is at state "1". In response to the block selection signal B the corresponding auxiliary VPP pump circuit 4 then outputs a VPP supply signal once and supplies VPP to a corresponding subarray.

The active command signal output from the command address control circuit 11 is also input to the VPP control circuit 13. While the command address control circuit 11 outputs the active command signal, the VPP control circuit 13 outputs an activation signal to cause the VPP pump circuit 3 to operate to the VPP pump circuit 3 when the voltage level of VPP is lower than the reference voltage level.

As mentioned above, in accordance with the first embodiment of the present invention, since the power supply control circuit is provided with the decoder 22 that determines the operation mode in which the semiconductor storage device is placed so as to output a block selection signal A, and the row control circuit 14 that generates and outputs a block selection signal B to one or more auxiliary VPP pump circuits 4 based on an active command signal and the block selection signal A, the power supply control circuit can efficiently supply VPP at the instant, at which the power consumption of VPP is large, following the selection of one or more subarrays 1, and can also efficiently supply VPP to one or more selected subarrays 5 in which the power consumption of VPP is large.

Furthermore, in accordance with the first embodiment, since the power supply control circuit is provided with the VPP pump circuit connected to all subarrays 1, for supplying VPP to all the subarrays 1, and the auxiliary VPP pump circuit connected to each of the plurality of subarrays 1, for supplying VPP to each of the plurality of subarrays 1, the area of the VPP pump circuit can be reduced.

In addition, in accordance with the first embodiment, since a row control circuit 14 corresponding to each selected subarray 5 outputs a block selection signal B to an auxiliary VPP pump circuit 4 corresponding to each selected subarray 5, and even if which any one or more subarrays are selected in either of the operation modes one or more auxiliary VPP pump circuits 4 corresponding to the one or more selected subarrays 5 can thus be activated, the ability to supply VPP can be optimized.

Furthermore, in accordance with the first embodiment, since the ability to supply VPP can be optimized and the voltage level of VPP never decreases in a disturbance acceleration test state using the test mode, the time required for the disturbance acceleration test can be shortened and the frequency of detection of defective pieces can be increased.

Embodiment 2.

A power supply control circuit for use in a semiconductor storage device according to a second embodiment of the present invention has the same arrangement as that of the power supply control circuit of the first embodiment as shown in FIG. 1. Therefore the explanation of the arrangement of the power supply control circuit of the second embodiment will be omitted hereafter. Furthermore, since the semiconductor storage device of the second embodiment has the same operation modes as those of the semiconductor storage device according to the first embodiment as shown in FIG. 2, the explanation of the operation modes will be omitted hereafter.

Figure 8:
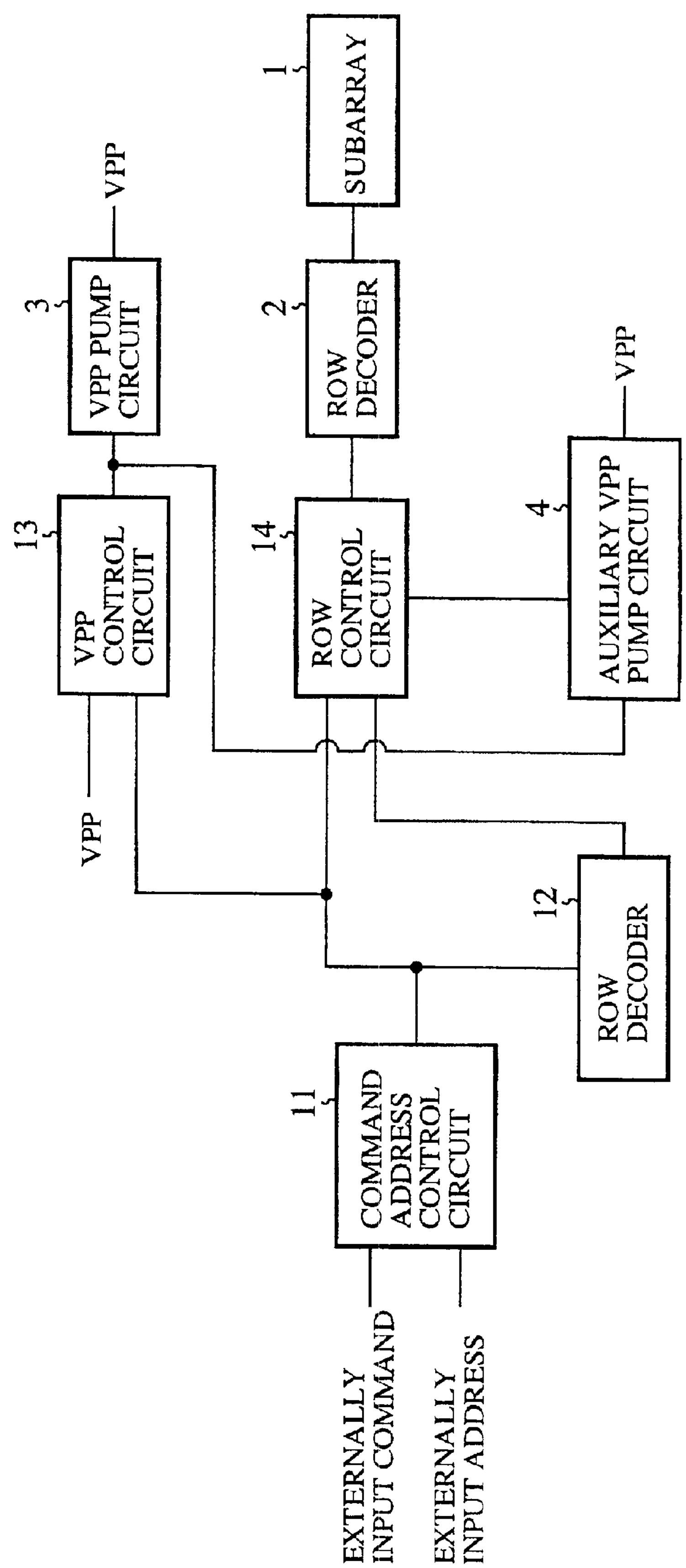
FIG. 8 is a block diagram showing the structure of a power supply control circuit of a semiconductor storage device according to a second embodiment of the present invention.

FIG. 8 is a block diagram showing the structure of the power supply control circuit of the semiconductor storage device according to the second embodiment of the present invention. In FIG. 8, since the same reference numerals as shown in FIG. 3 denote the same components as those of the power supply control circuit of the first embodiment or like components, the explanation of those components will be omitted hereafter. The power supply control circuit of the semiconductor storage device according to the second embodiment of the present invention differs from that of the above-mentioned first embodiment in that a VPP control circuit 13 delivers a detection signal to all auxiliary VPP pump circuits 4. Furthermore, a row pre-decoder 12 includes a block selection signal generation circuit which is the same as the block selection signal generation circuit shown in FIG. 4.

Figure 9:
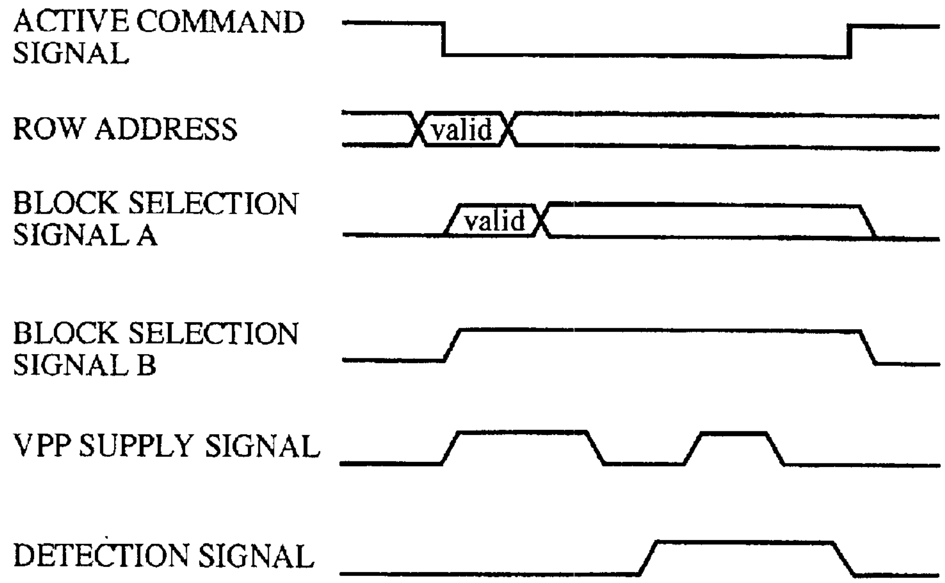
FIG. 9 is a timing chart showing an operation of the power supply control circuit according to the second embodiment of the present invention when the semiconductor storage device is placed in the normal active mode.
Figure 10:
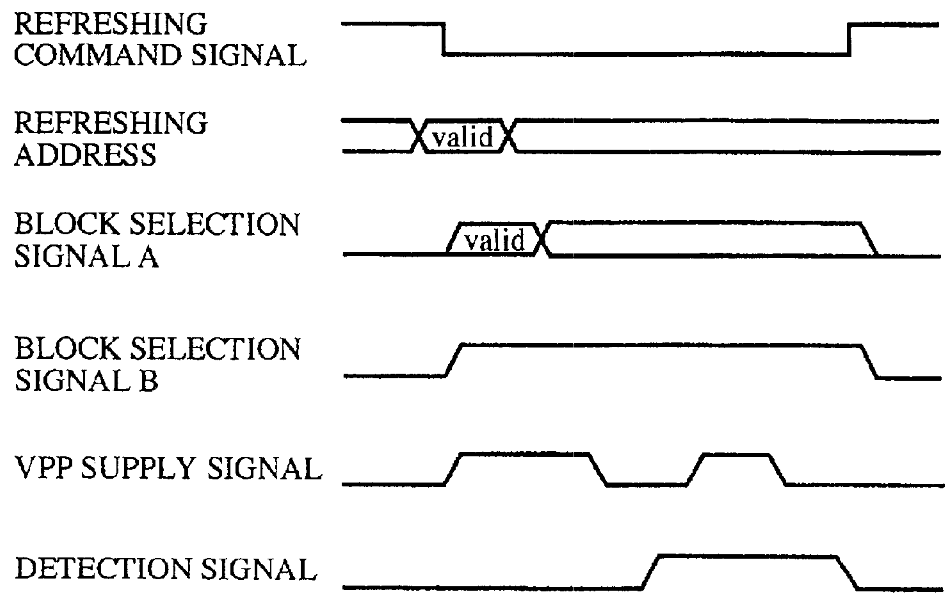
FIG. 10 is a timing chart showing an operation of the power supply control circuit according to the second embodiment of the present invention when the semiconductor storage device is placed in the refreshing mode.
Figure 11:
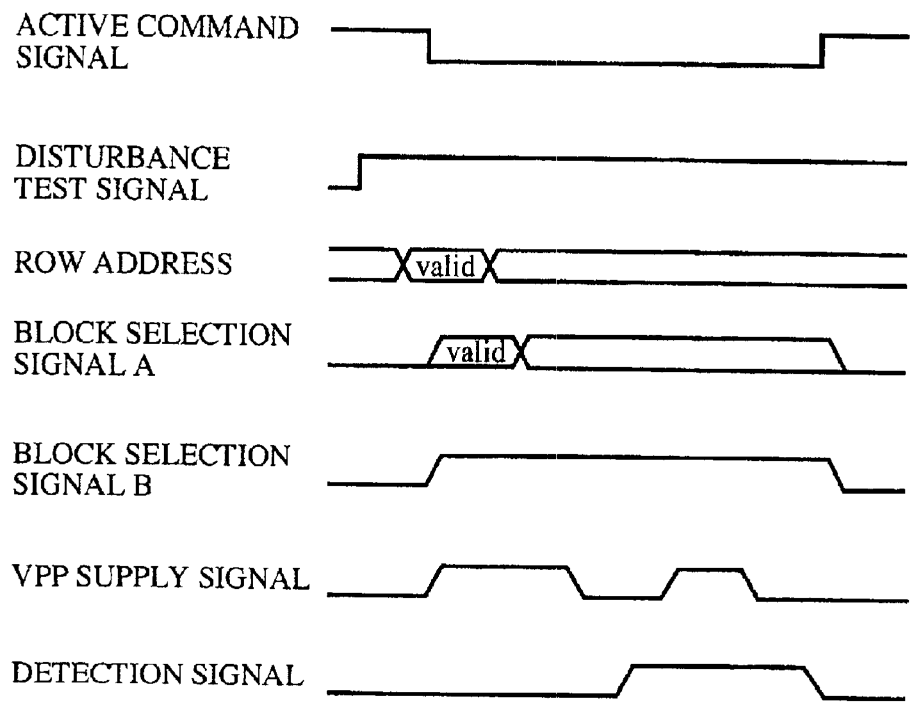
FIG. 11 is a timing chart showing an operation of the power supply control circuit according to the second embodiment of the present invention when the semiconductor storage device is placed in the test mode.
Figure 12:
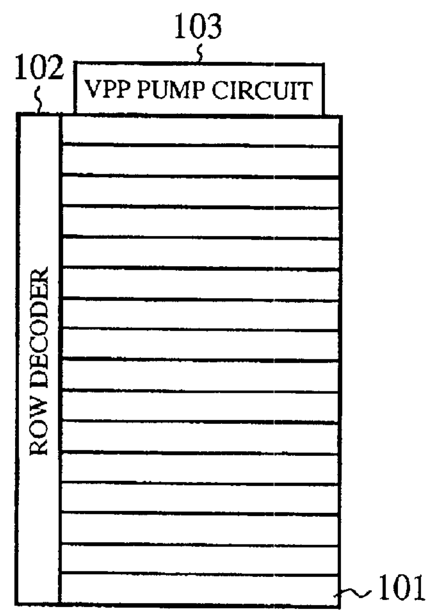
FIG. 12 is a block diagram showing an arrangement of a power supply control circuit of a prior art semiconductor storage device.
Figure 13C:
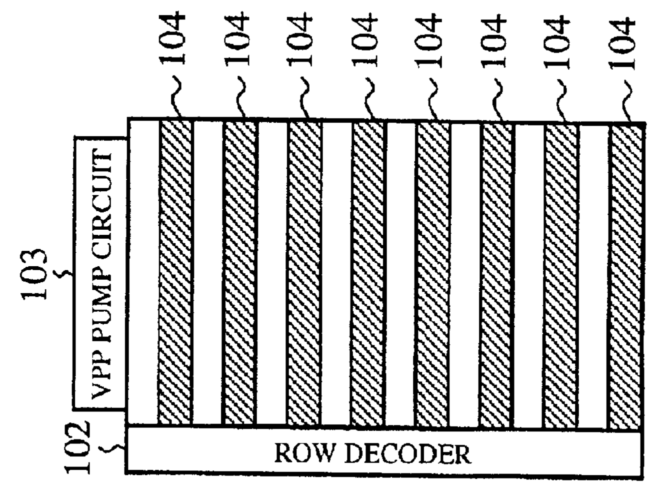
FIGS. 13A to 13C are drawings showing operation modes of the prior art semiconductor storage device.
Figure 13B:
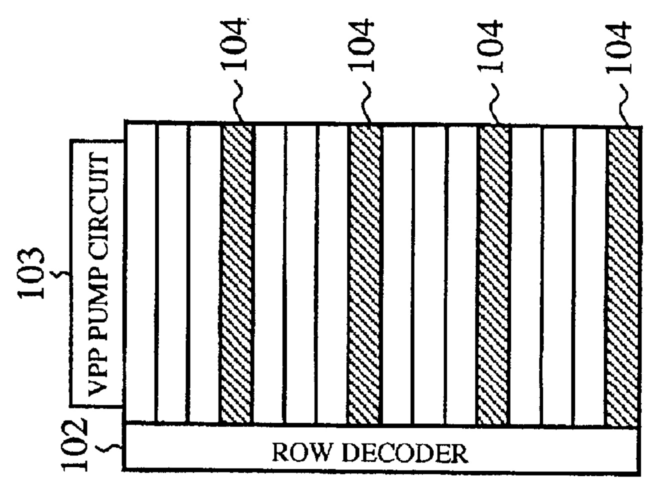
Figure 13A:
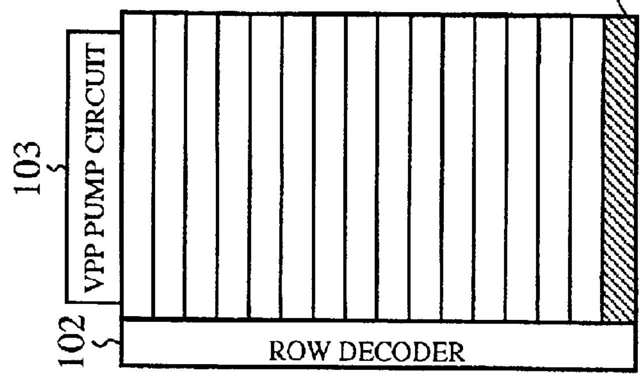

FIGS. 9 to 11 are timing charts showing operations of the power supply control circuit of the semiconductor storage device according to the second embodiment of the present invention. FIG. 9 is a timing chart showing an operation of the power supply control circuit when the semiconductor storage device is placed in normal active mode, FIG. 10 is a timing chart showing an operation of the power supply control circuit when the semiconductor storage device is placed in refreshing mode, and FIG. 11 is a timing chart showing an operation of the power supply control circuit when the semiconductor storage device is placed in a disturbance acceleration test state using test mode.

In accordance with the second embodiment, subarrays 1, a row decoder 2, a VPP pump circuit 3, a command address control circuit 11, the row pre-decoder 12, a row control circuit 14, a selector 21, and a decoder 22 operate in the same manner that the same components of the first embodiment do, and therefore the explanation of the operations of those components will be omitted hereafter. In addition, those components offer the same advantages as provided by the same components of the first embodiment and therefore the explanation of the advantages provided by those components will be omitted hereafter.

The description is directed to the normal active mode with reference to FIG. 9. The VPP control circuit 13 outputs a detection signal that indicates the voltage level of VPP to the VPP pump circuit 3 and all auxiliary VPP pump circuits 4, and also outputs an activation signal to cause the VPP pump circuit 3 to operate to the VPP pump circuit 3 when the voltage level of VPP is lower than a reference voltage level.

In response to a block selection signal B from each selected row control circuit 14, a corresponding auxiliary VPP pump circuit 4 outputs a VPP supply signal once and supplies VPP to a selected subarray. In addition, the corresponding auxiliary VPP pump circuit 4 outputs a VPP supply signal in response to the detection signal from the VPP control circuit 13 and supplies VPP to the selected subarray while the active command signal is output from the command address control circuit 11.

As shown in FIGS. 10 and 11, the VPP control circuit 13 and each selected auxiliary VPP pump circuit 4 operate even in the refreshing mode and at the time of a disturbance acceleration test using the test mode in the same manner that they do in the normal active mode as shown in FIG. 9.

As mentioned above, in accordance with the second embodiment of the present invention, the same advantage as provided by the above-mentioned first embodiment can be offered. In addition, since each selected auxiliary VPP pump circuit 4 outputs the VPP supply signal in response to the detection signal from the VPP control circuit 13 while either the active command signal or the refreshing command signal is output from the command address control circuit 11, the power supply control circuit can handle any decrease in the voltage level of VPP which occurs when the semiconductor storage device remains at a normal active state or a refreshing state for a long time.

In the first and the second embodiments mentioned above, the capacity and structure of each subarray, the number of subarrays into which the array of the semiconductor storage device is divided, the number of subarrays 1 which are activated in each operation mode can be changed. In the variant, the same advantages as offered by the first or second embodiment can be provided.

Furthermore, the present invention is not limited to the power supply control circuit of the semiconductor storage device, and, as an alternative, can be applied to a system LSI that contains a semiconductor storage device such as a DRAM.

Many widely different embodiments of the present invention may be constructed without departing from the spirit and scope of the present invention. It should be understood that the present invention is not limited to the specific embodiments described in the specification, except as defined in the appended claims.

What is claimed is:

1. A power supply control circuit for use in a semiconductor storage device, said circuit comprising:

a first power supply circuit connected to all subarrays of said semiconductor storage device, for supplying power to said all subarrays;

an operation mode determination circuit for determining an operation mode in which said semiconductor storage device is placed and for generating a first block selection signal based on address information applied thereto according to the determined operation mode;

a row control circuit disposed for each of said subarrays, for generating a second block selection signal based on the first block selection signal according to the determined operation mode; and a second power supply circuit disposed for each of said subarrays, for supplying power only to subarrays selected according to the second block selection signal from a corresponding row control circuit.

2. The power supply control circuit according to claim 1, wherein said operation mode determination circuit includes a selector for generating an internal address based on the address information according to the determined operation mode, and a decoder for generating the first block selection signal based on the internal address generated by said selector according to the determined operation mode.

3. The power supply control circuit according to claim 1, further comprising a control circuit for outputting a detection signal indicating a voltage level of the power supplied to said all subarrays, wherein said second power supply circuit supplies the power to the corresponding one of said all subarrays in response to the detection signal from the control circuit while the semiconductor storage device is placed in predetermined operation mode.

4. The power supply control circuit according to claim 2, further comprising a control circuit for outputting a detection signal indicating a voltage level of the power supplied to said all subarrays, wherein said second power supply circuit supplies the power to the corresponding one of said all subarrays in response to the detection signal from the control circuit while the semiconductor storage device is placed in predetermined operation mode.

* * * * *